Sept. 6, 1966 W. RINDNER ETAL 3,270,555

STRESS SENSITIVE TUNNEL DIODE TRANSDUCER

Filed Sept. 24, 1963

INVENTORS
WILHELM RINDNER
ROGER F. NELSON

BY Donald Brown
AGENT

United States Patent Office 3,270,555
Patented Sept. 6, 1966

3,270,555

STRESS SENSITIVE TUNNEL DIODE TRANSDUCER

Wilhelm Rindner, Lexington, Mass., and Roger F. Nelson, Mountain View, Calif., assignors to Raytheon Company, Lexington, Mass., a corporation of Delaware Filed Sept. 24, 1963, Ser. No. 311,013
3 Claims. (Cl. 73—88.5)

This invention relates to a semiconductor device, and more particularly to an Esaki or tunnel diode device which is stressed in order to alter the device's negative resistance characteristic.

The present invention sets forth a new and improved semiconductor stress-sensitive transducer device which will, if stressed in a small localized region, exhibit extensive alterations in its negative resistance characteristic.

The Esaki or tunnel diode is a new semiconductor device whose principle of operation is different from other semiconductor devices or vacuum tubes. These devices have a very high frequency limit which is several orders of magnitude higher than that obtainable with the drift or diffusion mechanism involved in the operation of conventional transistors. In such a device, the space charge or depletion region surrounding the junction of the device is made extremely thin, such as in the order of a millionth of an inch. This then permits carrier transition by means of tunneling so that the usual diffusion current in the conventional diode at small forward biases becomes relatively insignificant when the bias is increased and a negative resistance is displayed. The basic principles involved in the Esaki or tunnel diode is disclosed in United States Letters Patent No. 3,033,714, issued on May 8, 1962, in the name of Reona Esaki and Yuriko Kurose.

In the past, both Esaki and others have attempted to stress the alloyed dots of Esaki diodes to alter the characteristics of such devices, but due to their technique for applying this stress, changes which were noted by Esaki and others were relatively insignificant.

Accordingly, it is the object of this invention to provide a new, improved, and significantly stress-sensitive Esaki or tunnel diode device.

It is a further object of this invention to provide a semiconductor transducer which is sensitive to a stress confined to a small region of the device.

It is an additional objective to alter the negative resistance characteristics of an Esaki or tunnel diode device in accordance with the magnitude of the stress applied.

It is a further object of this invention to apply this new and improved stress-sensitive Esaki or tunnel diode device to an oscillatory circuit.

In accordance with the preferred embodiment of this invention, a conventional tunnel diode is preferentially etched to remove at least a portion of an alloyed dot layer, thus exposing at least a portion of a recrystallized material layer between the alloyed dot layer and a base material layer. By applying a variable concentrated, nonuniform, anisotropic stress to a small surface area of this exposed recrystallized material layer, and by forward-biasing this diode in a conventional manner, extensive alterations in the negative resistance characteristic of the diode are obtained.

Other objectives and features of the invention will become apparent from the following description taken in conjunction with the following drawings, wherein.

Figure 1:
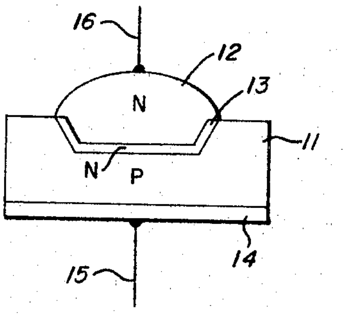
FIG. 1 is a side elevational view of a conventional Esaki or tunnel diode semiconductor device.

Referring now to FIG. 1, which shows a side elevation view of a conventional Esaki or tunnel diode semiconductor device, an N-type recrystallized material layer 13 of the diode device is shown positioned between a P-type base layer 11 and an N-type metallic dopant alloy dot layer 12. A metal base layer 14 is attached to the P-type layer 11 and forms an ohmic junction therewith. Ohmic contacts 15 and 16 are shown coupled to layer 14 and dot 12, respectively, as external leads for the device.

Figure 2:
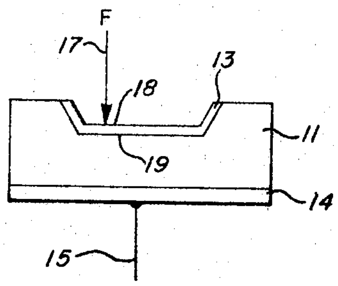
FIG. 2 is a side elevational view of the conventional diode device of FIG. 1 after preferential etching.

Referring now to FIG. 2, there is disclosed a modified version of the structure of FIG. 1, according to the preferred embodiment of this invention. It is noted that the metallic dot N-type material 12 has been removed so as to expose the recrystallized material layer 13. This dot material is removable, utilizing standard etchant techniques such as common to both the semiconductor and printed circuit art. In this particular embodiment, a preferential etchant, such as hydrogen peroxide, could be utilized to remove the dot material.

An arrow 17 denoting a force to provide a stress to the top surface 18 of the recrystallized layer 13 is shown. This arrow represents a device to provide a force confined to a small area of the top surface 18. This force then produces a stress within the recrystallized material 13 and at the rectifying junction 19 between the recrystallized material layer 13 and layer 11. This stress is applied in such a manner as to confine the stress to a small volume of the recrystallized material 13. A device for producing this stress is disclosed in the following copending United States applications, Serial No. 183,940, filed on March 30, 1962, now abandoned, and Serial No. 261,065, filed on February 26, 1963 in the name of Wilhelm Rindner, a co-inventor of this invention, and assigned to a common assignee. The above-mentioned copending applications disclose a pivotal-type device having a pointed tip on one end which is utilized to bear on a surface to produce a stress. This pointed tip, as disclosed in the aforementioned copending applications, could consist of a metallic needle, a standard sapphire phonograph needle, or a diamond phonograph needle. For the purposes of this invention, it has been discovered that a point with a bearing surface having a small radius of curvature less than 250 microns provides the best observed effects when the point is used to bear against the top surface 18 of the recrystallized layer 13.

Figure 3:
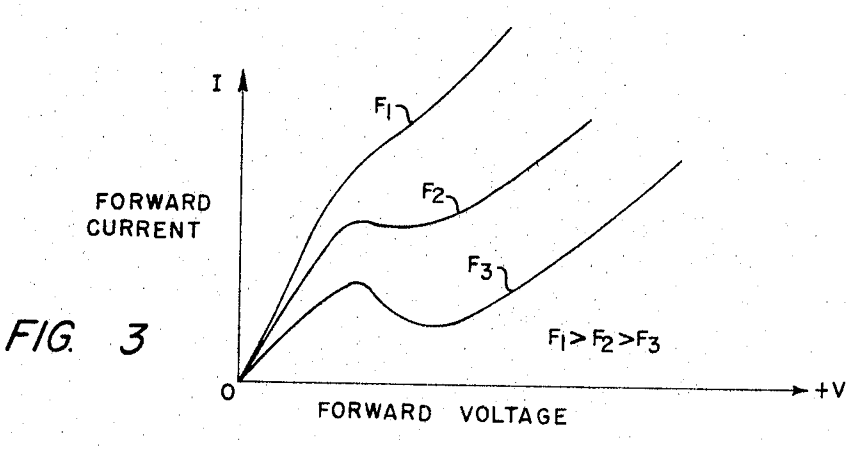
FIG. 3 is a graph of voltage and current of the modified diode device of FIG. 2 showing the effect of stress applied to the diode device.

Referring to FIG. 3, a graph of voltage and current characteristics of the modified Esaki or tunnel diode device of FIG. 2 is disclosed. This graph shows the effect of a force F which causes a stress so as to alter the negative resistance characteristic of the diode of FIG. 2. Forces in the order of between 4000 and 10,000 dynes applied to the recrystallized material 13 have been utilized to achieve the variations in the basic negative resistance characteristic curves noted in FIG. 3.

It is to be noted that the application of a force $F_1$, substantially equal to 10,000 dynes, applied to surface 18 with a bearing surface having a radius of curvature equal to twenty microns, will substantially remove the negative resistance characteristic of this device. Accordingly, it is possible to permit operation of this device similar to a normal diode by applying a stress of sufficient magnitude. Curves $F_2$ and $F_3$ result from forces of substantially 6000 and 4000 dynes, respectively. Thus, by altering or varying the magnitude of a force applied to a surface of a recrystallized material of a modified tunnel diode device, it is possible to utilize this structure as a transducer device to sense pressure, force, or other measurable physical changes.

Figure 4:
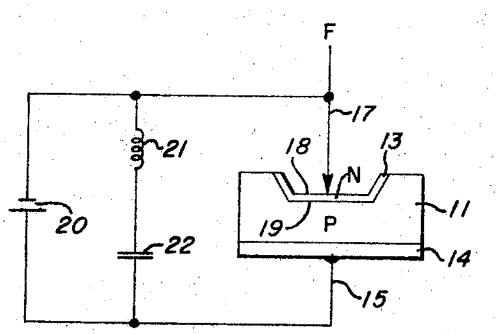
FIG. 4 is a schematic diagram of an oscillation circuit, by way of example, showing the use of the diode according to this invention.

FIG. 4 shows the device of FIG. 2 in an oscillatory circuit. A biasing source 20 is shown connected across a resonant LC network 21 and 22. Connected in parallel with the resonant LC network is shown the diode device according to this invention. One end of the LC network is connected to the force-applying point 17, which in this instance is of a metal material, so as to provide an ohmic contact at the top surface 18 of the recrystallized material 13. This metallic point is also of a radius of curvature of less than two-hundred-fifty microns in order to obtain the best observed results. By varying the force F, both the frequency and the amplitude of the oscillations of this circuit are altered. In fact, if a sufficient force is applied so as to obtain the curve shown as $F_1$ of FIG. 3, it is possible to dampen or prevent the oscillatory circuit from oscillating. Thus, it is possible to utilize this device as a transducer to either produce an oscillatory signal having variations in frequency or amplitude which are representative of the magnitude of a force or pressure being sensed, or as a switch wherein oscillations are negative or cancelled upon the application of a force of a sufficient magnitude.

Figure 5:
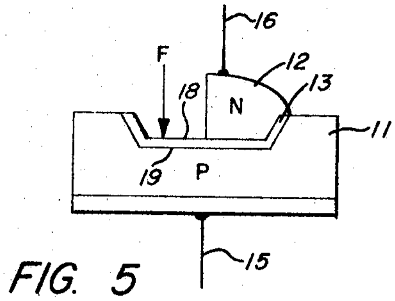
FIG. 5 is an alternate embodiment of a diode showing a portion of the alloyed dot layer remaining to permit an ohmic contact to be made.

FIG. 5 shows an alternate embodiment of the device disclosed in FIG. 2. In this embodiment the metallic dot layer 12 is only partially removed so as to permit the ohmic contact 16 to remain. In this embodiment, the metallic dot 12 is first masked and then the unmasked portion is preferentially etched, as previously disclosed.

Although no specific materials have been called for, it is to be noted that semiconductor materials, such as silicon, germanium or other equivalents, could be utilized. Additionally, it is to be noted that diodes of the type described herein could be formed utilizing diffusion, epitaxial, or other methods for producing highly doped junctions. Accordingly, it is desired that this invention not be limited except as defined by the appended claims.

What is claimed is:

1. A tunnel diode transducer comprising a first layer of semiconductor material of a first conductivity type, a second layer of recrystallized semiconductor material of opposite conductivity type on said first layer and forming a rectifying junction therewith, a metallic alloyed dot on said second layer and of the same conductivity type as said second layer, said alloyed dot covering only a portion of said second layer so as to expose only a portion of the surface thereof, a metal base layer on said first layer, ohmic contacts on said alloyed dot and base layer, and means engaging a restricted area of said exposed surface of said second layer for applying concentrated stress to a restricted volume of the second layer and thereby altering the negative resistance characteristic of said junction.

2. A transducer in accordance with claim 1 wherein said means comprises a member having a bearing surface with a radius of curvature of less than 250 microns.

3. A transducer in accordance with claim 1 wherein said means comprises a needle of insulating material.

References Cited by the Examiner

UNITED STATES PATENTS

| | | | |
|---|---|---|---|
| 2,632,062 | 3/1953 | Montgomery | 73—88.5 |
| 2,898,477 | 8/1959 | Hoesterey | 307—88.5 |
| 3,065,636 | 11/1962 | Pfann | 73—88.5 |
| 3,107,277 | 10/1963 | Rogers | 73—88.5 |

OTHER REFERENCES

Rogers, E. S.: "Experimental Tunnel-Diode Electromechanical Transducer Elements and Their Use in Tunnel-Diode Microphones." In The Journal of the Acoustical Society of America 34 (7); pp. 883–893, July 1962.

Instrument Practice: article entitled "Semiconductor Survey; Part II: Negative Resistance Devices," by C. M. Sinclair, November 1962, pp. 1368–1370 relied on.

RICHARD C. QUEISSER, *Primary Examiner.*

J. C. GOLDSTEIN, *Assistant Examiner.*